United States Patent
Bhatia et al.

(10) Patent No.: US 9,589,773 B2
(45) Date of Patent: Mar. 7, 2017

(54) IN-SITU ETCH RATE DETERMINATION FOR CHAMBER CLEAN ENDPOINT

(71) Applicant: Applied Materials, Inc., Santa Clara, CA (US)

(72) Inventors: Sidharth Bhatia, Santa Cruz, CA (US); Anjana M. Patel, San Jose, CA (US); Abdul Aziz Khaja, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/136,788

(22) Filed: Apr. 22, 2016

(65) Prior Publication Data
US 2016/0314944 A1 Oct. 27, 2016

Related U.S. Application Data

(60) Provisional application No. 62/151,825, filed on Apr. 23, 2015.

(51) Int. Cl.
*G01L 21/30* (2006.01)
*G01R 31/00* (2006.01)
*H01J 37/32* (2006.01)

(52) U.S. Cl.
CPC ... *H01J 37/32963* (2013.01); *H01J 2237/334* (2013.01)

(58) Field of Classification Search
USPC .......................................................... 216/59
See application file for complete search history.

(56) References Cited

U.S. PATENT DOCUMENTS

| 5,712,702 | A | 1/1998 | McGahay et al. |
| 6,079,426 | A * | 6/2000 | Subrahmanyam .. C23C 16/4405 134/1.1 |
| 6,124,927 | A | 9/2000 | Zhong et al. |
| 6,358,362 | B1 | 3/2002 | En et al. |
| 6,815,362 | B1 | 11/2004 | Wong et al. |
| 8,048,326 | B2 | 11/2011 | Yue et al. |
| 2001/0051439 | A1 | 12/2001 | Khan et al. |

FOREIGN PATENT DOCUMENTS

WO 02090615 A1 11/2002
WO 2015026057 A1 2/2015

OTHER PUBLICATIONS

International Search Report and Written Opinion for International Application No. PCT/US2016/024475 dated Aug. 26, 2016.

* cited by examiner

*Primary Examiner* — Roberts Culbert
(74) *Attorney, Agent, or Firm* — Patterson + Sheridan, LLP

(57) ABSTRACT

Embodiments described herein relate to methods for determining a cleaning endpoint. A first plasma cleaning process may be performed in a clean chamber environment to determine a clean time function defined by a first slope. A second plasma cleaning process may be performed in an unclean chamber environment to determine a clean time function defined by a second slope. The first and second slope may be compared to determine a clean endpoint time.

20 Claims, 4 Drawing Sheets

IN-SITU ETCH RATE DETERMINATION FOR CHAMBER CLEAN ENDPOINT

CROSS-REFERENCE TO RELATED APPLICATIONS

This application claims benefit to U.S. Provisional Patent Application No. 62/151,825, filed Apr. 23, 2015, the entirety of which is herein incorporated by reference.

BACKGROUND

Field

Embodiments of the present disclosure generally relate to methods for determining processing chamber cleaning endpoints. More specifically, embodiments described herein relate to methods for in-situ etch rate determinations for chamber clean endpoint detection.

Description of the Related Art

Clean time is often a significant factor in semiconductor manufacturing processes and equipment productivity. Clean time generally refers to the amount of time required to clean a piece of manufacturing equipment. Cleaning processes are often performed periodically to increase the useful life of manufacturing equipment. Cleaning processes also reduce the probability of manufacturing defective microdevices as a result of sub-optimal processing environments within the manufacturing equipment. Accordingly, clean time associated with equipment cleaning has a relatively large impact on particle reduction and throughput efficiency.

Insufficient clean time may cause the undesirable accumulation of reactant products and byproducts within the manufacturing equipment which may result in increased device defectivity and process drift. Alternatively, excessive clean time can result in prolonged exposure to corrosive environments which may result in premature degradation of the manufacturing equipment components. In addition, excessive clean time has a generally negative impact on throughput.

Current endpoint detection methods for determining clean time generally involve monitoring a secondary radical or plasma signal. Conventional methods include the use of residual gas analysis (RGA), optical emission spectroscopy (OES), non-dispersive infrared spectroscopy (NDIR), etc. for endpoint determination. However, these methods may provide inaccurate endpoint determinations as a result of sub-optimal metrology conditions. For example, the lack of secondary plasma dissociation for RGA may result in inaccurate data for determining suitable endpoints. In another example, the lack of radicals/plasma at the detection location for OES may adversely affect the endpoint data. In addition, the instruments required to perform the aforementioned analysis may be prohibitively expensive and may not be compatible on all types of equipment where it is desirable to perform endpoint detection.

Therefore, what is needed in the art are improved methods for endpoint detection.

SUMMARY

In one embodiment, a method of endpoint detection is provided. The method includes performing a first plasma cleaning process in a clean chamber environment and determining first etch rates at two or more time intervals during the first plasma cleaning process. A first slope defined by the two or more time intervals may be determined and the first slope may define the first etch rates as a function of time. A second plasma cleaning process may be performed in an unclean chamber environment and second etch rates may be determined at two or more time intervals during the second plasma cleaning process. A second slope defined by the two or more time intervals may be determined and the second slope may define the second etch rates as a function of time. The first slope and the second slope may be compared to determine a clean endpoint time.

In another embodiment, a method of endpoint detection is provided. The method includes performing a first plasma cleaning process in a clean chamber environment and determining first etch rates at two or more time intervals during the first plasma cleaning process. A first slope defined by the two or more time intervals may be determined and the first slope may define the first etch rates as a function of time. A second plasma cleaning process may be performed in an unclean chamber environment and second etch rates may be determined at two or more time intervals during the second plasma cleaning process. A second slope defined by the two or more time intervals may be determined and the second slope may define the second etch rates as a function of time. An endpoint time range defined by the two or more time intervals may be determined and the first slope and the second slope may be compared within the endpoint time range to determine a clean endpoint time at a point where the first slope and the second slope are substantially equal.

In yet another embodiment, a method of endpoint detection is provided. The method includes performing a first cleaning process in a clean chamber environment and determining a first etch rate for the first cleaning process. A second cleaning process may be performed in the clean chamber environment and a second etch rate for the second cleaning process may be determined. The first etch rate and the second etch rate may define a first slope. A third cleaning process may be performed in an unclean chamber environment and a third etch rate of the third cleaning process may be determined. A fourth cleaning process may be performed in the unclean chamber environment and a fourth etch rate of the fourth cleaning process may be determined. The third etch rate and the fourth etch rate may define a slope within about 2% of the first slope. A clean endpoint time may be determined where the first slope and the second slope are substantially equal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods for determining a cleaning endpoint. A first plasma cleaning process may be performed in a clean chamber environment to determine a clean time function defined by a first slope. A second plasma cleaning process may be performed in an unclean chamber environment to determine a clean time function defined by a second slope. The first and second slope may be compared to determine a clean endpoint time.

Figure 1:
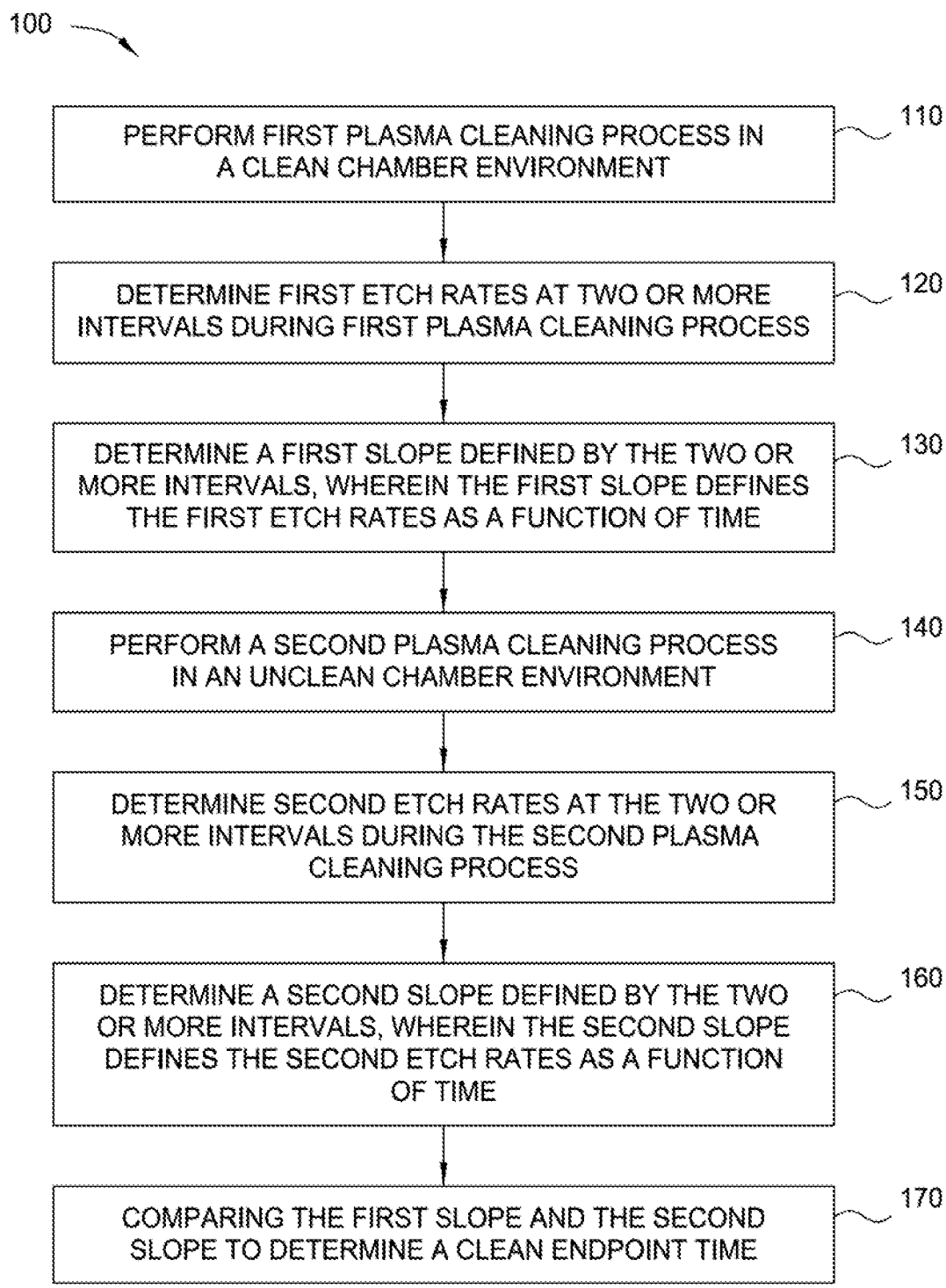
FIG. 1 illustrates operations of a method for determining a cleaning process endpoint time according to embodiments described herein.

FIG. 1 illustrates operations of a method 100 for determining a cleaning process endpoint time. At operation 110, a first plasma cleaning process may be performed in a clean chamber environment. A clean chamber environment, at described herein, is a chamber environment which is substantially free of material deposition on various components within a processing volume of the chamber. The plasma cleaning process may utilize a plasma generated in-situ or the plasma may be generated remotely. Suitable plasma generation techniques, such as inductive coupling, capacitive coupling, or thermal plasma generation techniques, may be utilized to form the cleaning plasma.

Various cleaning chemistries may be utilized to form the cleaning plasma. Suitable precursor materials for forming a cleaning plasma include fluorine containing materials, chlorine containing materials, oxygen containing materials, and the like. It is contemplated that the cleaning plasma chemistry may be selected to be reactive with materials deposited in the chamber environment. In one embodiment, fluorine radicals formed from $NF_3$ may be utilized during the first plasma cleaning process. Operation 110 is generally performed to define a baseline reference for subsequent comparison of a plasma cleaning process, such as the plasma cleaning process of operation 140. It should be noted, as described below, that the baseline reference may be thermally unstable.

Figure 2:
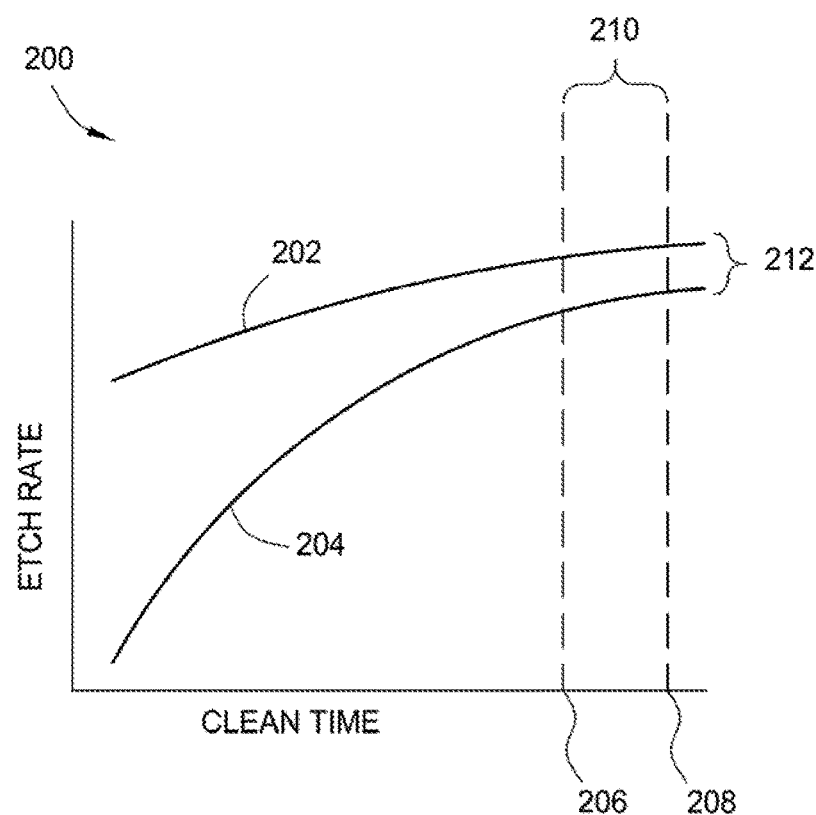
FIG. 2 illustrates a graph depicting etch rates as a function of clean time for plasma processes performed in a clean chamber environment and an unclean chamber environment according to embodiments described herein.

FIG. 2 illustrates a graph 200 depicting etch rates as a function of clean time for plasma processes performed in a clean chamber environment and an unclean chamber environment. Curve 202 is representative of the etch rate as a function of time in a clean chamber environment and curve 204 is representative of the etch rate as a function of time in an unclean chamber environment. As illustrated, a slope of the curve 202 increases slightly over time and it is believed that the increase may be due to an increase in processing chamber component temperature within the clean chamber environment rather than the recombination of cleaning radicals as a result of increased temperatures within the clean chamber environment.

Referring back to FIG. 1, the method 100 continues at operation 120 by determining first etch rates at two or more time intervals 206, 208 (See FIG. 2) during the first plasma cleaning process. Although two time intervals are described, it is contemplated that more time intervals may be selected to investigate the first etch rates. The two or more time intervals 206, 208 may define a clean endpoint range 210. The first etch rates refer to the amount of material removed within a specific amount of time, for example, Å/second. As illustrated in FIG. 2, the first etch rates may be determined at a first time interval 206 and a second time interval 208. In one embodiment, a first etch rate may correspond to the first time interval 206 and a second etch rate may correspond to the second time interval 208. The first etch rate may be determined in a primary first plasma cleaning process and the second etch rate may be determined in a secondary first plasma cleaning process.

At operation 130, a first slope of the curve 202 defined by the two or more intervals 206, 208 may be determined. The first slope may be determined by selecting a point on the curve 202 within the clean endpoint range 210 and the first slope may be the tangent line at the selected point. Accordingly, the first slope generally defines the first etch rates of the clean chamber environment as a function of time.

At operation 140, a second plasma cleaning process may be performed in an unclean chamber environment. The unclean chamber environment is different from the clean chamber environment in that material deposits exist on various components within the unclean chamber environment. In one embodiment, the second plasma cleaning process may be similar to the first plasma cleaning process. Accordingly, the same or similar chemistries and processing conditions may be utilized in both the first and second plasma cleaning processes.

At operation 150, second etch rates at the two or more time intervals 206, 208 may be determined during the second plasma cleaning process. Curve 204 is representative of the second etch rates as a function of time in an unclean chamber environment. Generally, the time intervals utilized during operation 120 are the same time intervals utilized during operation 150. Similar to the first etch rates, the second etch rates refer to the amount of material removed within a specific amount of time, for example, A/second. As described above, the second etch rates may be determined at the first time interval 206 and the second time interval 208. In one embodiment, the second etch rates are representative of a thermal oxide etch rate.

In one embodiment, a third etch rate may correspond to the first time interval 206 and a fourth etch rate may correspond to the second time interval 208. The third etch rate may be determined in a primary second plasma cleaning process (i.e. a third plasma cleaning process) and the fourth etch rate may be determined in a secondary second plasma cleaning process (i.e. a fourth plasma cleaning process). In one embodiment, the second etch rates (i.e. the third and fourth etch rates) may be determined by suitable metrology equipment, such as optical metrology equipment, for example, an ellipsometer or the like.

At operation 160, a second slope defined by the two or more intervals 206, 208 may be determined for the curve 204. Similar to the first slope determination in operation 130, the second slope may be determined by selecting a point on the curve 204 within the clean endpoint range 210 and the second slope may be the tangent line at the selected point. Accordingly, the second slope generally defines the second etch rates of the unclean chamber environment as a function of time.

It should be noted that the second curve 204 may have an asymptotic relationship to the first curve 202. A delta 212 between the first curve 202 and the second curve 204 within the clean endpoint range 210 is believed to be caused by the thermal instability of the first curve 202.

At operation 170, the first slope and the second slope may be compared to determine a clean endpoint time. Generally, the first slope and second slope may differ by less than about 5%, such as within about 2%. A clean endpoint time within the clean endpoint range 210 may be determined when the first slop and the second slop are substantially equal. Substantially equal slopes, as utilized herein, refers to the first slope and second slope differing by no more than about 2%.

Optionally, after determining the clean time endpoint, an amount of additional cleaning time may be added to the clean time endpoint to ensure complete cleaning. In one embodiment, the additional amount of cleaning time may be less than about 5% of the total clean time.

Figure 3:
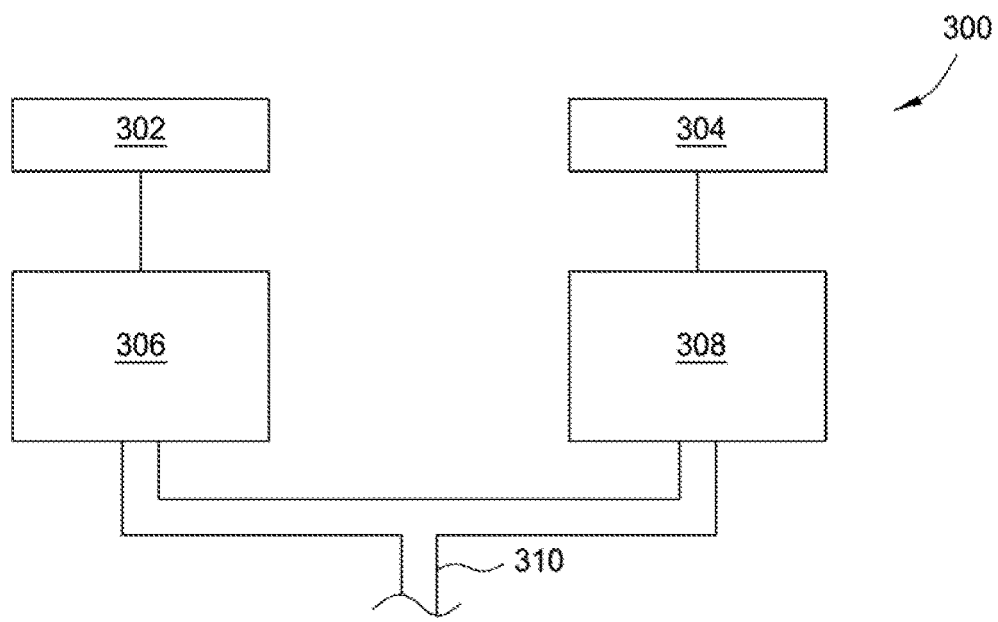
FIG. 3 schematically illustrates a processing system in which embodiments of the methods may be implemented according to embodiments described herein.

FIG. 3 schematically illustrates a processing system 300 in which embodiments of the method 100 may be implemented. It is contemplated that the method 100 described herein provides for advantageous in-situ clean end point determination without utilizing external equipment associated with conventional endpoint detection processes. The processing system 300 includes a first remote plasma source 302 and a second remote plasma source 304 which are respectively coupled to a first processing chamber 306 and a second processing chamber 308. The first and second processing chamber 306, 308 are generally exhausted via a foreline 310 after performing cleaning processes.

Figure 4:
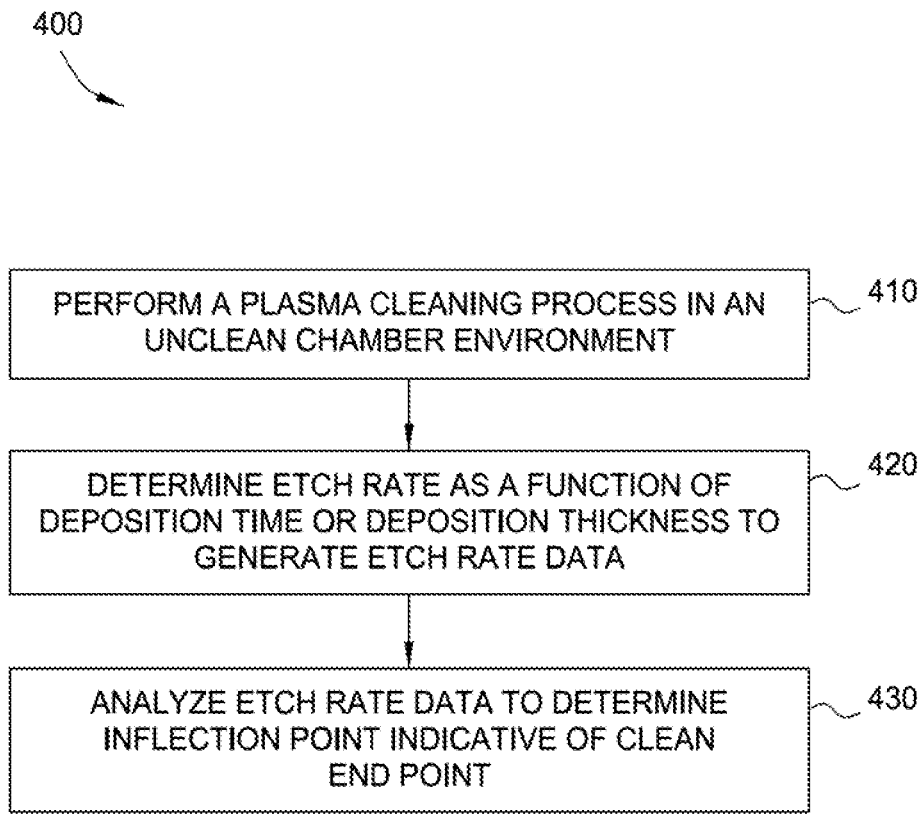
FIG. 4 illustrates operations of a method for determining a cleaning process endpoint time according to embodiments described herein.

FIG. 4 illustrates operations of a method 400 for determining a cleaning process endpoint time. At operation 410, a plasma cleaning process may be performed in an unclear chamber environment. The cleaning process may be similar to the process described with regard to operation 140 in certain embodiments. At operation 420, etch rate as a function of deposition time or deposition thickness may be determined to generate etch rate data. At operation 430, the etch rate data may be analyzed to determine an inflection point or change in slope of the data plotted on a graph which is indicative of a clean end point. Accordingly, the etch rate data may be utilized to determine a cleaning end point and/or the amount of time a cleaning process may be performed to sufficiently clean a processing chamber or processing chamber components.

Figure 5:
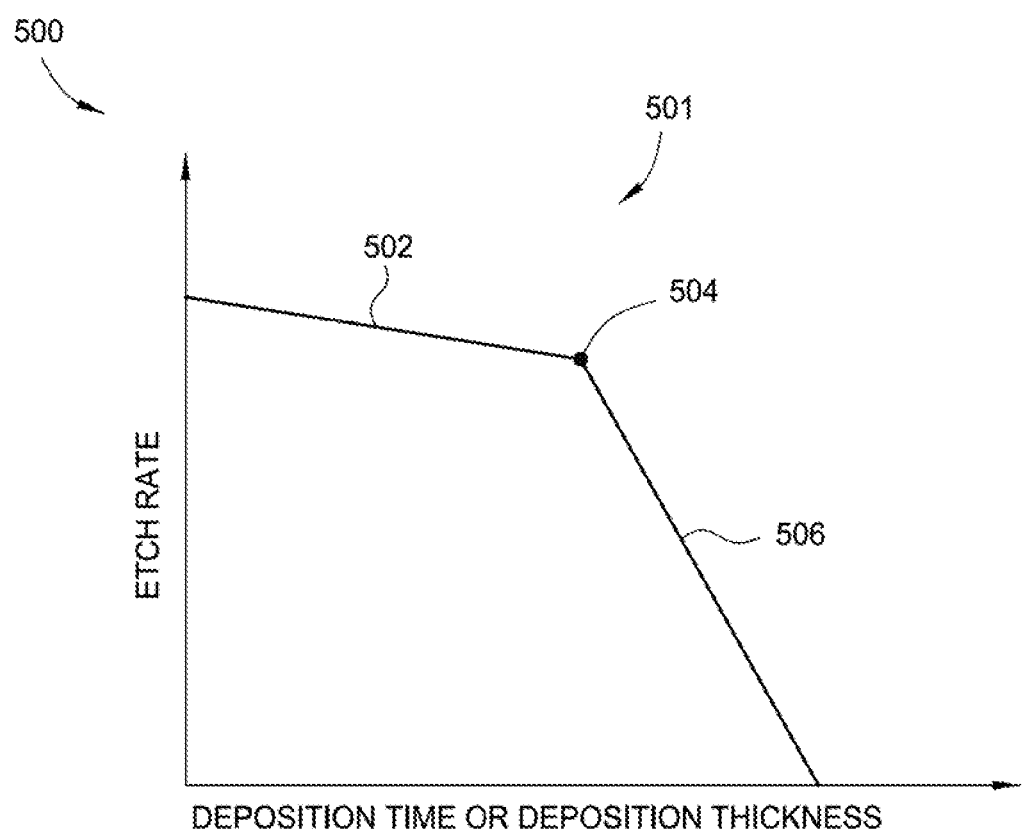
FIG. 5 illustrates a graph depicting etch rate as a function of deposition time or deposition thickness for plasma processes performed in an unclean chamber environment according to embodiments described herein.

FIG. 5 illustrates a graph 500 depicting etch rate as a function of deposition time or deposition thickness for plasma processes performed in an unclean chamber environment. The graph 500 depicts data 501 of an etch rate as a function of deposition time or deposition thickness. The data 501 includes a first slope 502 which is representative of an etch rate actively removing material from a processing chamber environment. The data 501 also includes a second slope 506 which is representative of an etch rate where no material is being actively removed or removed at an increased rate. The second slope 506 is believed to be indicative of the etch rate associated with clean chamber environments.

An inflection point 504 of the data 501 is present at a point between the first slope 502 and the second slope 506 where the slopes 502, 506 are different. The inflection point 504 may be utilized to determine a cleaning end point where a chamber environment is sufficiently clean but not over cleaned. Similar to the method 100, after determining the clean time endpoint via analysis of the inflection point 504, an amount of additional cleaning time may be added to the clean time endpoint to ensure complete cleaning. In one embodiment, the additional amount of cleaning time may be less than about 5% of the total clean time.

Conventional endpoint detection methods generally analyze the effluent in the foreline 310. However, the cleaning etch rates within each chamber 306, 308 may be different and a flawed endpoint may be indicated as a result of monitoring a single effluent stream from multiple chambers. The methods described herein may be applied to each of the chambers 306, 308, and it is contemplated that endpoint detection may be improved as a result of individualized endpoint detection for each separate chamber. For example, the methods described herein may be implemented on various single or multiple chamber architectures, such as the PRODUCER® system, available from Applied Materials, Inc., Santa Clara, Calif.

In summation, in-situ endpoint detection may be determined by performing a first plasma cleaning process in a clean chamber environment and performing a second plasma cleaning process in an unclean chamber environment. Clean time functions for the first and second plasma cleaning processes may be derived and slopes of the functions may be compared to determine a suitable clean endpoint. Endpoint detection may also be determined by analyzing an inflection point of etch rate data indicative of a clean chamber environment. It is contemplated that utilizing the methods described herein may improve clean endpoint time accuracy and improve throughput while preventing damage to chamber components due to over cleaning.

While the foregoing is directed to embodiments of the present disclosure, other and further embodiments of the disclosure may be devised without departing from the basic scope thereof, and the scope thereof is determined by the claims that follow.

What is claimed is:

1. A method of endpoint detection, comprising:
performing a first plasma cleaning process in a clean chamber environment;
determining first etch rates at two or more time intervals during the first plasma cleaning process;
determining a first slope defined by the two or more time intervals, wherein the first slope defines the first etch rates as a function of time;
performing a second plasma cleaning process in an unclean chamber environment;
determining second etch rates at two or more time intervals during the second plasma cleaning process;
determining a second slope defined by the two or more time intervals, wherein the second slope defines the second etch rates as a function of time; and
comparing the first slope and the second slope to determine a clean endpoint time.

2. The method of claim 1, wherein the first plasma cleaning process defines a baseline reference.

3. The method of claim 2, wherein the baseline reference is thermally unstable.

4. The method of claim 1, wherein the clean chamber environment is substantially devoid of material deposits.

5. The method of claim 1, wherein the first plasma cleaning process and the second plasma cleaning process utilize a fluorine based chemistry, a chlorine based chemistry, an oxygen based chemistry, or combinations and mixtures thereof.

6. The method of claim 1, wherein the two or more time intervals for the first plasma cleaning process and the two or more time intervals for the second plasma cleaning process are the same.

7. The method of claim 1, wherein the two or more time intervals define an endpoint time range.

8. The method of claim 7, wherein the endpoint time range is determined by comparing the first slope and the second slope.

9. The method of claim 8, further comprising:
determining the clean endpoint time within the endpoint time range at a point where the first slope and second slope are substantially equal.

10. The method of claim 1, further comprising:
after determining the clean endpoint time, adding an amount of clean time less than about 5% of the total clean time to the clean endpoint time.

11. A method of endpoint detection, comprising:
performing a first plasma cleaning process in a clean chamber environment;
determining first etch rates at two or more time intervals during the first plasma cleaning process;
determining a first slope defined by the two or more time intervals, wherein the first slope defined the first etch rates as a function of time;
performing a second plasma cleaning process in an unclean chamber environment;
determining second etch rates at two or more time intervals during the second plasma cleaning process;
determining a second slope defined by the two or more time intervals, wherein the second slope defines the second etch rates as a function of time;
determining an endpoint time range defined by the two or more time intervals; and
comparing the first slope and the second slope within the endpoint time range to determine a clean endpoint time at a point where the first slope and the second slope are substantially equal.

12. The method of claim 11, wherein the two or more time intervals for the first plasma cleaning process and the two or more time intervals for the second plasma cleaning process are the same.

13. The method of claim 11, wherein the first plasma cleaning process defines a baseline reference.

14. The method of claim 13, wherein the baseline reference is thermally unstable.

15. A method of endpoint detection, comprising:
performing a first cleaning process in a clean chamber environment;
determining a first etch rate for the first cleaning process;
performing a second cleaning process in the clean chamber environment;
determining a second etch rate for the second cleaning process, wherein the first etch rate and the second etch rate define a first slope;
performing a third cleaning process in an unclean chamber environment;
determining a third etch rate of the third cleaning process;
performing a fourth cleaning process in the unclean chamber environment;
determining a fourth etch rate of the fourth cleaning process, wherein the third etch rate and the fourth etch rate define a second slope within about 2% of the first slope; and
determining a clean endpoint time where the first slope and the second slope are substantially equal.

16. The method of claim 15, wherein the first slope defines a baseline reference.

17. The method of claim 16, wherein the first slope if thermally unstable.

18. The method of claim 15, wherein the first cleaning process, the second cleaning process, the third cleaning process, and the fourth cleaning process utilize a fluorine based chemistry, a chlorine based chemistry, an oxygen based chemistry, or combinations and mixtures thereof.

19. The method of claim 15, further comprising:
determining an end point time range by comparing the first slope and the second slope over an interval where the first slope and the second slope are substantially equal.

20. The method of claim 15, further comprising:
after determining the clean endpoint time, adding an amount of clean time less than about 5% of the total clean time to the clean endpoint time.

* * * * *